United States Patent [19]

Simoudis et al.

[11] Patent Number: 5,016,204

[45] Date of Patent: May 14, 1991

[54] EXPERT SYSTEM FOR PERFORMING DIAGNOSTIC AND REDESIGN OPERATIONS INCORPORATING MULTIPLE LEVELS OF SIMULATION DETAIL

[75] Inventors: Evangelos Simoudis, Marlboro; Richard P. Evans, Bolton; Donald G. Vonada, Stow, all of Mass.

[73] Assignee: Digital Equipment Corporation, Maynard, Mass.

[21] Appl. No.: 316,775

[22] Filed: Feb. 28, 1989

[51] Int. Cl.$^5$ ............................................ G06F 15/18
[52] U.S. Cl. ..................................... 364/578; 364/513
[58] Field of Search ............... 364/578, 148, 513, 200, 364/900, 150-152

[56] References Cited

U.S. PATENT DOCUMENTS

| | | | |
|---|---|---|---|
| 4,736,306 | 4/1988 | Christensen et al. | 364/513 |
| 4,773,028 | 9/1988 | Tallman | 364/550 |
| 4,835,709 | 5/1989 | Tsai | 364/513 |
| 4,866,635 | 9/1989 | Kahn et al. | 364/513 |

OTHER PUBLICATIONS

Bond, "Integrating Prolog and CADAM to Produce an Intelligent CAD System", pp. 152-160, 1987, IEEE, Westex-87, Conference on Expert Systems.
Dixon, "Artificial Intelligence and Design—A Mechanical Engineering View", 8/11/86, 5th National Conference on AI.
Nii, "Blackboard Systems: Blackboard Application Systems, Blackboard System from a Knowledge Engineering Perspective", pp. 82-106, the AI Magazine, 8/86.
Nii, "Blackboard Systems: The Blackboard Mode/of Problem Solving and Evolution of Blackboard Architectures", pp. 38-53, the AI Magazine, Summer 1986.
Dixon et al., "Expert Systems for Mechanical Design: Examples of Symbolic Representations of Design Geometries", 1-10-1987, Engineering with Computers 2.
Gelsey, "Automated Reasoning about Machine Geometry and Kinematics", 1987, pp. 182-187, IEEE, AI Application Conference.

Primary Examiner—Thomas G. Black
Attorney, Agent, or Firm—Finnegan, Henderson, Farabow, Garrett, and Dunner

[57] ABSTRACT

An expert system for performing a redesign operation in connection with an original design. A working memory includes a plurality of blackboards each for storing a design representation and desired operational characteristics. A simulation component comprises a plurality of simulators each for generating simulated operational characteristics in connection with a design representation on one of said blackboards. A diagnostic component identifies operational discrepancies between the simulated operational characteristics and the desired operational characteristics and the causes of the operational characteristics. A redesign component generates a redesign of the design representations on the blackboards in response to the original design and the identified dicrepancies and discrepancy causes.

16 Claims, 6 Drawing Sheets

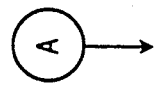

CONTROL APPLIES META RULES IDENTIFIED BY REDESIGN KS SELECT K. SRCE TO ELIGIBILITY FLAG OF APPROPRIATE BLACKBOARD SYSTEM TO SELECT A REDESIGN K. SRCE, STORES IDENTIFICATION THEREOF IN SELECTED K. SRCE ID PORTION OF BLACKBOARD SYSTEM

CONTROL MODULE APPLIES REDESIGN RULES, SEQUENCED ACCORDING TO SCHEDULING RULES, OF SELECTED REDESIGN K. SRCE TO DESIGN REPRESENTATION

FIG.2B

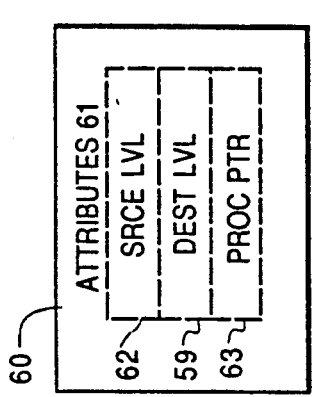

SIMULATOR K. SRCE

FIG.1B

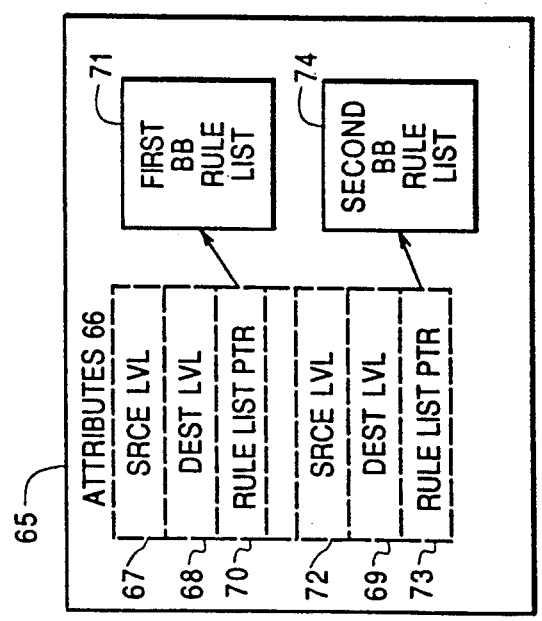

ANALYTICAL K. SRCE OR DIAGNOSTIC K. SRCE

FIG.1C

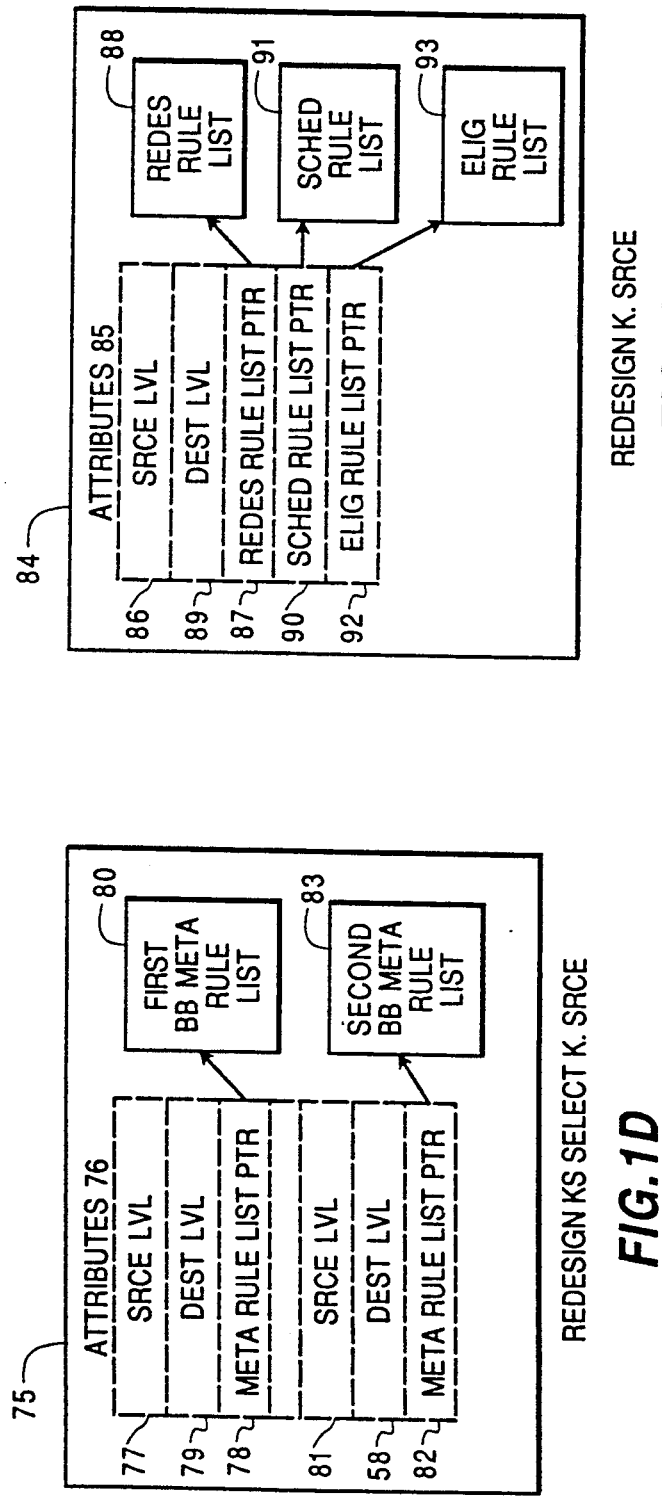

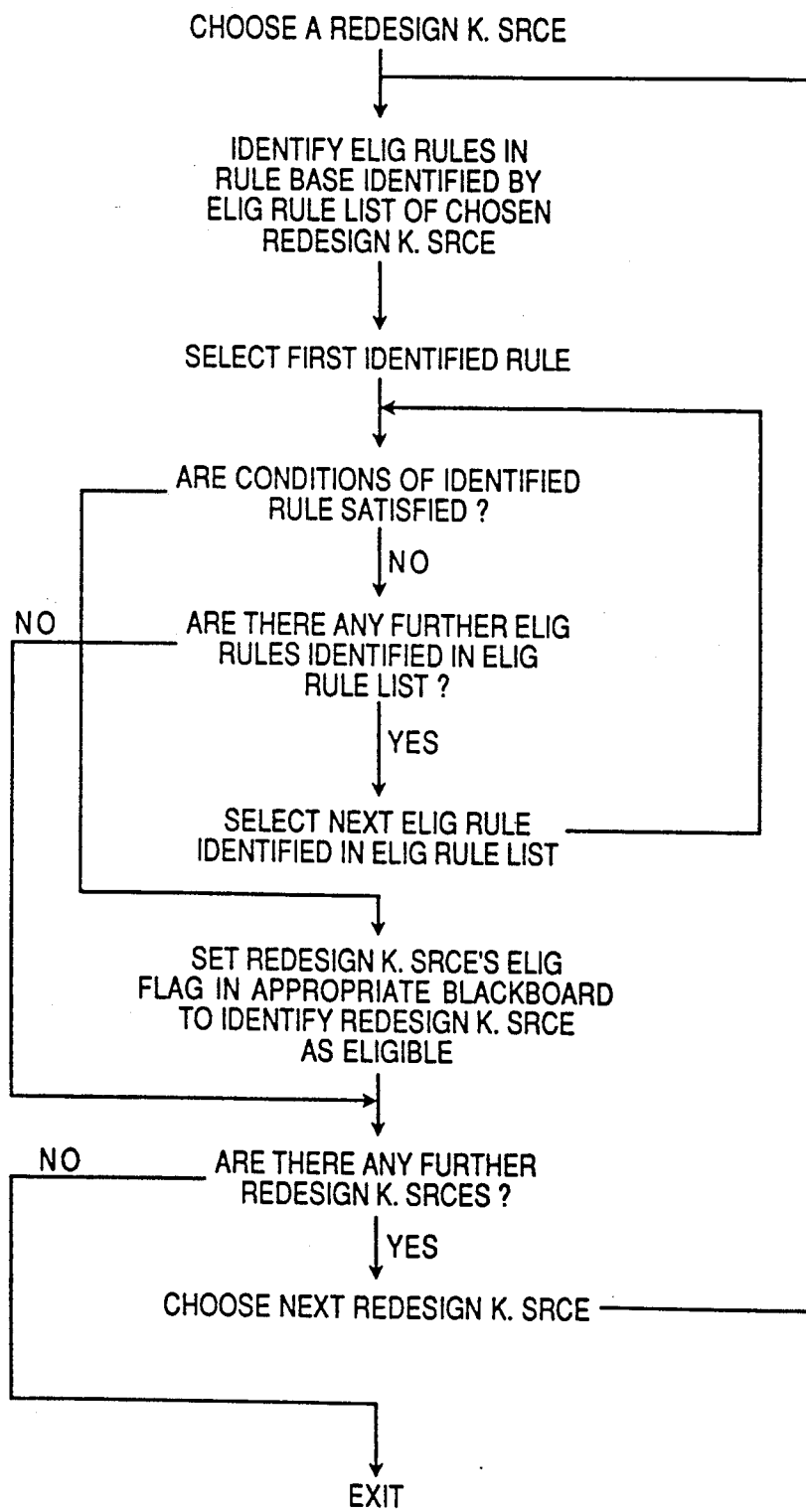

REDESIGN K. SRCE APPLICATION PHASE

EXPERT SYSTEM FOR PERFORMING DIAGNOSTIC AND REDESIGN OPERATIONS INCORPORATING MULTIPLE LEVELS OF SIMULATION DETAIL

INCORPORATION BY REFERENCE

U.S. patent application Ser. No. 07/106,840 now abandoned, filed Oct. 8, 1987, in the name of Evangelos Simoudis, for System Design Tool For Assisting In The Design Of A Complex System, and assigned to the assignee of the present application, incorporated herein by reference.

U.S. patent application Ser. No. 07/270,893, filed Nov. 14, 1988, in the name of Evangelos Simoudis, for Expert System Including Arrangement For Acquiring Redesign Knowledge, incorporated herein by reference.

U.S. patent application Ser. No. 07/284,198, filed Dec. 14, 1988, in the name of Evangelos Simoudis for A Modular Blackboard-Based Expert System, incorporated herein by reference.

A Rules Appendix, attached hereto, is incorporated herein by reference.

FIELD OF THE INVENTION

The invention relates generally to the field of rule-based expert systems, and more particularly to expert systems for assisting in the redesign of a complex system. In one embodiment, the invention provides an expert system for assisting in the redesign of an electrical circuit in response to differences between desired operating characteristics of the circuit, as established by an operator, and simulated operating characteristics of the circuit.

BACKGROUND OF THE INVENTION

Typical expert systems include a knowledge base, a working memory and a control level, or inference engine. The knowledge base contains knowledge represented in the form of either production rules or procedures or a combination of both. The working memory, which is also termed a "blackboard", contains a set of facts, which may be established at the beginning of operation of the system, during prior processing by the system, or by an operator in response to, for example, inquiries from the expert system during processing. The control level controls the operation of the system in a series of execution cycles during which it processes the rules or procedures in connection with the contents of the working memory.

Production rules generally comprise two levels, namely, a condition level, generally identified as the "left-hand side" of the rule, and an action or consequent list, which is generally identified as the "right-hand side" of the rule. The condition level identifies one or more conditions which may be satisfied by the facts in the blackboard. The action list specifies one or more actions in connection with the system, such as adding, deleting or modifying a fact on the blackboard, transmitting a message to the operator, or halting the execution cycle. If the conditions comprising a rule's condition level are satisfied, the rule is said to "fire", in which case the control level executes the operations specified in the action list.

Procedures are essentially computer programs that define a series of steps or operations to be performed during an execution cycle. The procedure may specify, for example, one or more actions to be taken in connection with the system such as storing facts in the blackboard, transmitting a message to the operator or halting the execution cycle.

The aforementioned '840 application describes an expert system that assists in the redesign of complex systems, such as electrical circuits. In using the expert system, an operator supplies an initial design for the complex system, and a set of operational constraints. The expert system simulates the design and determines whether the operation of the design, as indicated by the simulation, conforms to the operational constraints. If not, a redesign element assists in the redesign of the complex system to more closely conform to the operational constraints. The expert system then simulates the redesigned complex system. This procedure may be repeated several times until the operation of the complex system conforms to the operational constraints specified by the operator.

To accomplish the redesign, the expert system in the aforementioned '840 application includes redesign operators, each of which operates to modify one of various aspects of the design, based on knowledge, in the form of rules, organized in a multi-level hierarchy. In response to the representation of the design, as provided by the operator or in response to a redesign, design constraints and the cause of a discrepancy between the operational constraints and the simulated operation of the design, a solution selection knowledge module selects one of many redesign solutions which are capable of eliminating the discrepancies by modifying the design. Each redesign solution, in turn, includes the various redesign operators, and redesign operator control knowledge indicating the order in which the redesign operators are to be applied to accomplish the redesign The solution selection knowledge and the redesign operator control knowledge in the expert system are both in the form of rules. The rules in the solution selection knowledge module fire in response to the information concerning the various solutions which are capable of eliminating the discrepancies, the design constraints and the causes of the discrepancies between the simulated operation and the desired operation of the complex system. Firing of a rule in the solution selection knowledge module initiates operation of a redesign solution. The rules comprising the redesign operator control knowledge of a redesign solution, on the other hand, determines the order in which the redesign operators are to be applied.

The redesign operators, which are operators that indicate the various primitive redesign operations that may be provided in the system, form part of the "knowledge" in the system. The redesign operator control knowledge provides a level of control knowledge as to the sequencing of application of the redesign operators to achieve a particular redesign goal. The solution selection knowledge provides a level of "meta-knowledge", that is, knowledge about the control knowledge provided by the redesign operator control knowledge in the expert system.

SUMMARY OF THE INVENTION

The invention provides a new and improved expert system that performs a simulation of the operation of a digital electrical circuit network and a redesign operation to redesign the circuit in response to discrepancies between the desired operation of the circuit and the simulated operation as identified during the simulation.

In brief summary, the new expert system performs a redesign operation in connection with a original design. A working memory includes a plurality of blackboards each for storing a design representation and desired operational characteristics. A simulation component comprises a plurality of simulators each for generating simulated operational characteristics in connection with a design representation on one of said blackboards. A diagnostic component identifies operational discrepancies between the simulated operational characteristics and the desired operational characteristics and the causes of the operational discrepancies. A redesign component generates a redesign of the design representations on the blackboards in response to the original design and the identified discrepancies and discrepancy causes.

In particular, the expert system includes a simulation component that includes two simulation levels that simulate the operation of the circuit in multiple levels of particularity. One simulation level performs a simulation operation at a low degree of detail and particularity, performing the simulation operation quickly. On the other hand, another simulation performs a simulation operation at a detailed level, that is, with a high degree of detail and particularity, which requires a longer time to complete than the high-level simulation operation. The expert system includes two blackboard systems, one associated with each of the simulation levels. The operator loads a design representation representing the design to be processed into the blackboard system associated with the simulation system providing the degree of detail desired. Following a simulation operation, a diagnostic component analyzes the results of the simulation and compares it to the desired operational characteristics as provided by the operator, and identifies discrepancies therebetween and the causes of the discrepancies.

Following the diagnostic operation, a redesign component is used to perform a redesign operation in connection with the discrepancies identified by the diagnostic component. The redesign component includes a plurality of knowledge sources, each of which identifies rules that effect a predetermined type of redesign operation in connection with the circuit, and each of which is associated with one level. The redesign component uses one knowledge source at the level of the simulation in effecting the redesign.

Providing a high-level simulation, and associated redesign, which can be performed relatively rapidly, permits quick rough redesign operations to be performed in connection with a design representation to obtain a design whose operation generally corresponds to the operation as desired by the operator. The design can thereafter be refined to more closely correspond to the desired operation through slower and more detailed low-level simulation and redesign operations.

BRIEF DESCRIPTION OF THE DRAWINGS

This invention is pointed out with particularity in the appended claims. The above and further advantages of this invention may be better understood by referring to the following description taken in conjunction with the accompanying drawings, in which:

FIGS. 1B through 1E are diagrams of data structures useful in the expert system depicted in FIG. 1A;

FIGS. 2A and 2B are flow diagrams generally detailing the operations of the expert system depicted in FIG. 1;

FIGS. 3A through 3B-2 are flow diagrams depicting the operations of the redesign component of the expert system depicted in FIG. 1.

DETAILED DESCRIPTION OF AN ILLUSTRATIVE EMBODIMENT

Figure 1A:
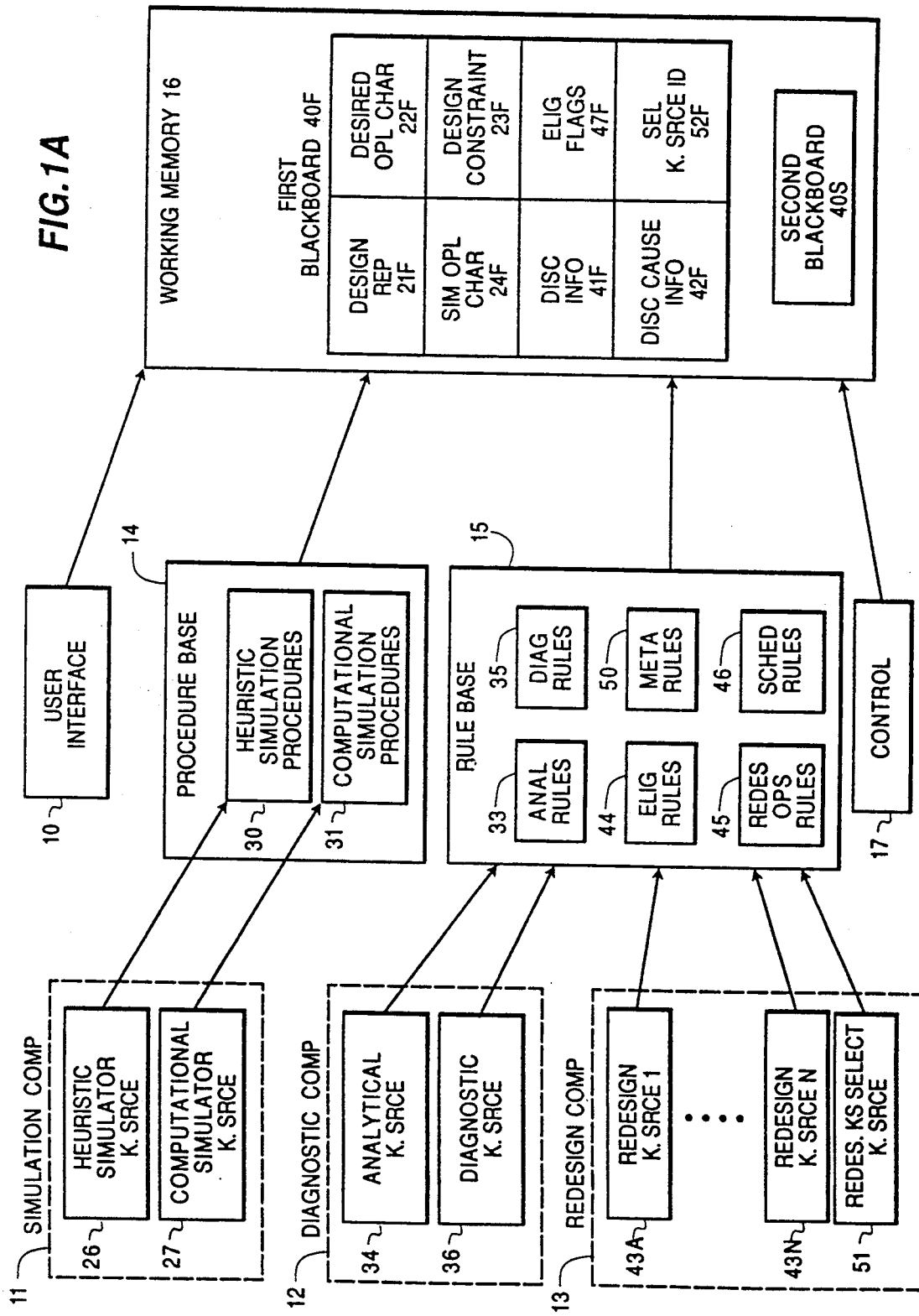
FIG. 1A is a general functional block diagram of an expert system constructed in accordance with the invention.
Figure 2A:
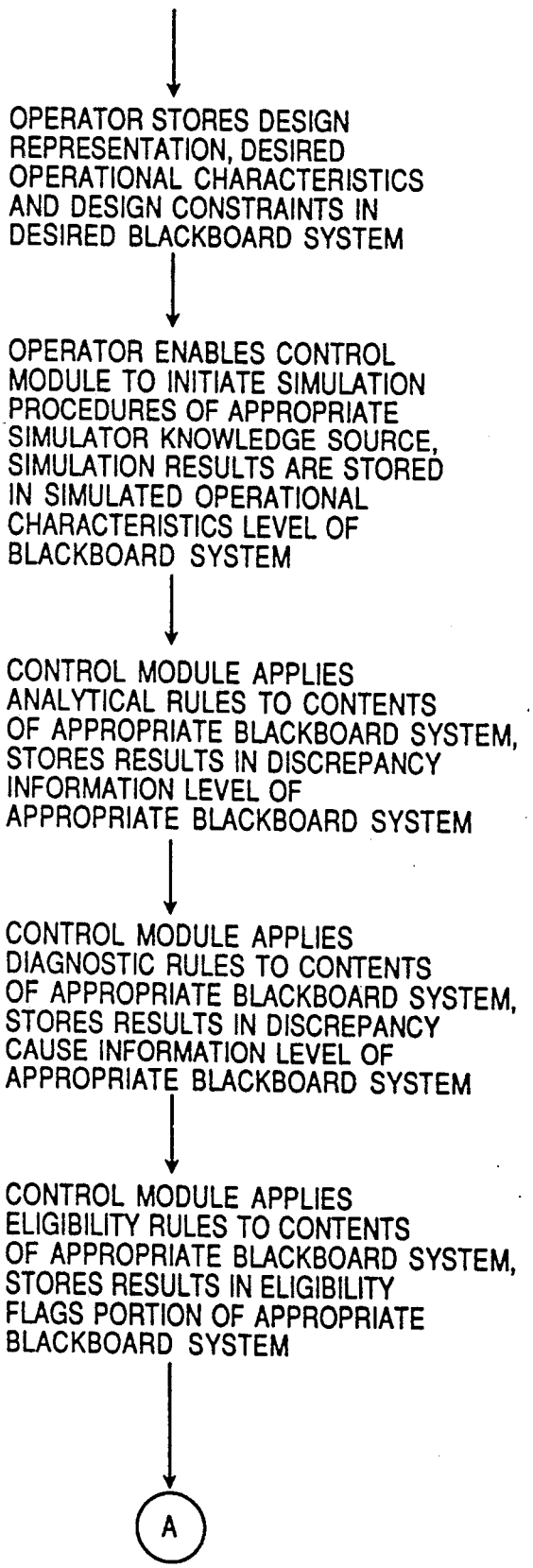

FIG 1A is a general functional block diagram of an expert system constructed in accordance with the invention for assisting in designing of a complex system such as a digital electrical circuit network, simulating the operation of the circuit, determining differences between the simulated operation of the circuit and the desired operation of the circuit and redesigning the circuit to reduce or eliminate the determined differences. It will be appreciated that the expert system may be in the form of a computer program processed by a digital data processing system, which is not specifically shown as an element in FIG. 1A.

With reference to FIG. 1A, the expert system generally includes an operator interface 10 through which an operator interacts with other elements in the system. Several components, including a simulation component 11, a diagnostic component 12 and a redesign component 13 identify procedures in a procedure base 14 or rules in a rule base 15 which are used in connection with the simulation, diagnostic and redesign operations as described above. The rules included in one embodiment of the expert system which is used in connection with redesign of a digital electrical circuit network, are contained in a Rules Index, which is attached hereto and incorporated by reference.

The expert system performs simulation, diagnostic and redesign operations in two degrees of detail, including a low degree of detail and a high degree of detail. For the low degree of detail, the expert system performs simulation using a heuristic simulator, which determines gross and generally unquantified operational characteristics of the design representation. For the degree of detail, the expert system performs a simulation operation using a simulator such as SPICE, which may require much more time than the heuristic simulator to determine detailed and generally quantified operational characteristics.

The design being processed by the expert system, and other information used during operation of the expert system, are stored in two blackboard systems, including a first blackboard system 40F and a second blackboard system 40S, in a working memory 16. The blackboards are similar and so only one, namely blackboard 40F, is shown in detail. The high-level blackboard includes several levels for storing information which is used in processing in response to other elements of the expert system. In particular, the first blackboard system 40F includes a design representation level 21F for storing a design representation, a desired operational characteristics level 22F for storing a set of desired operational characteristics, and a design constraints level 23F for storing design constraints.

The high-level blackboard also includes a simulated operational characteristics level 24F for storing the results of simulation. A discrepancy information level 41F stores identified discrepancies between the desired operational characteristics and simulated operational characteristics. A discrepancy cause information level 42F stores identified causes of the discrepancies identified in level 41F. The high-level blackboard also includes an eligibility flags level 47F and a selected knowledge source identification level 52F for storing other information as set forth below. The second blackboard system 40S includes levels similar to the levels comprising first blackboard system 40F.

A control module 17 controls operation of the other elements of the expert system, to initiate operations in connection with the simulation component 11, diagnostic component 12 and diagnostic component 13 using the contents of the working memory 16. The control module 17 operates as an executive and inference engine, initiating operation of procedures in the procedure base 14 and testing of rules in the rule base 15 as described below.

Under control of the control module 17, the operator first loads, through the user interface 10, a design representation representing the circuit under consideration into the design representation level 21F, of the blackboard 40F or the corresponding level of the blackboard 40S. The operator identifies whether the design is to be processed using high-level or low-level simulation, diagnosis and redesign, and the control module loads the design representation in the level 21F of first blackboard system 40F or the corresponding level of second blackboard system 40S, depending on the level identified by the operator. Along with the design representation, the operator also provides desired operational characteristics, which indicate how the circuit is to operate and design constraints, indicating various constraints or limitations, such as cost, physical size, etc., required on the design, which the control module 17 loads into desired operational characteristics level 22F and design constraints level 23F of the first blackboard system 40F or the corresponding levels of the second blackboard system 40S, as identified by the operator.

Figures 1, 3B:
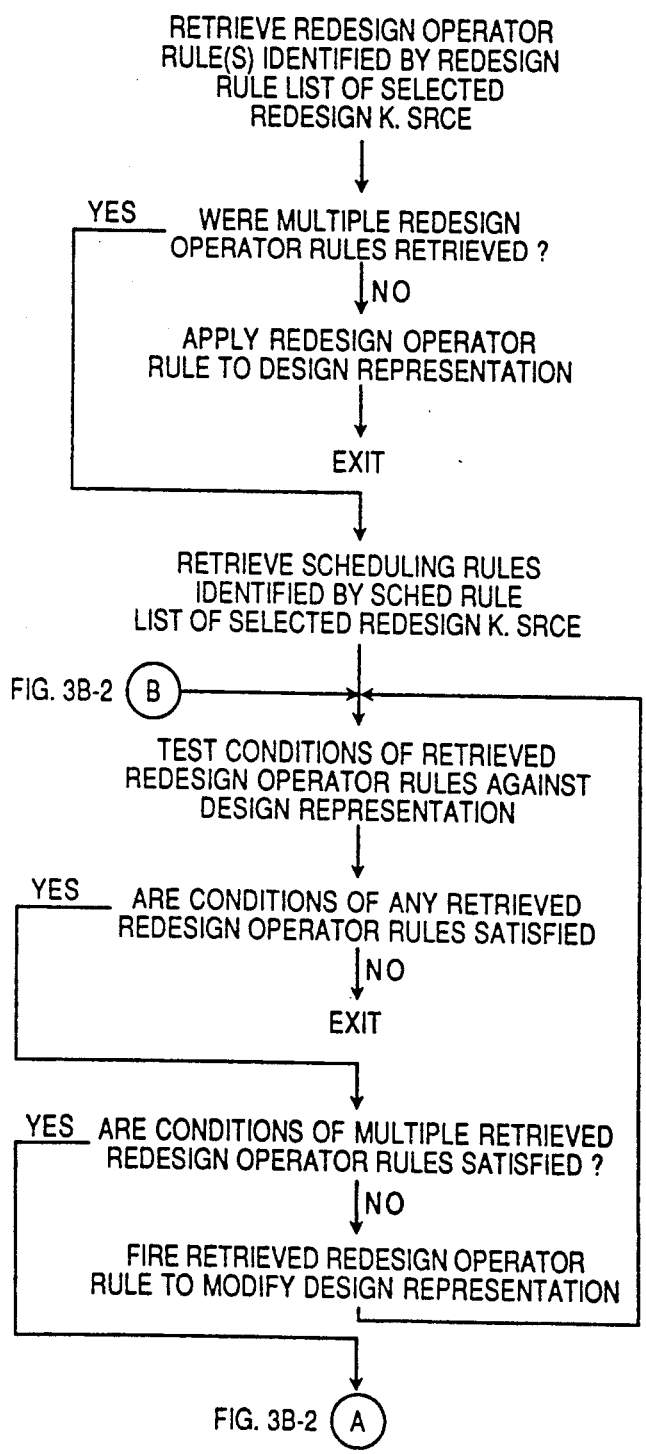
Figures 2, 3B:
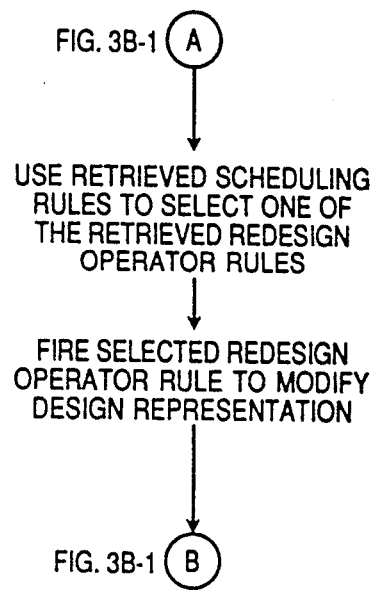

The operations of the expert system depicted in FIG. 1 proceed in three general phases, namely, a simulation phase, a diagnosis phase and a redesign phase, under control of the control module 17. During the simulation phase, the control module 17 enables simulation procedures identified by the simulation component 11 to be applied to the design representation in design representation level 21F in first blackboard system 40F or the corresponding design representation level in second blackboard system 40S. To accommodate the multiple levels of simulation detail, the simulation component 11 includes a heuristic simulation knowledge source 26 and computation simulation knowledge source 27, both of which are described in greater detail below in connection with FIG. 1B. The heuristic simulation knowledge source identifies heuristic simulation procedures 30 in the procedure base 14, and the computational simulation knowledge source 27 identifies computational simulation procedures 31 in the procedure base 14.

During the simulation phase, the control module 17 uses the heuristic simulation knowledge source 26 to identify the heuristic simulation procedures 30, and enables the procedures 30 to be applied to a design representation in design representation 21F in first blackboard system 40F. Similarly, the control module 17 uses the computational simulation knowledge source 27 to identify the computations simulation procedures 31, and enables the procedures 31 to be applied to a design representation in second blackboard system 40S. The results of a simulation operation performed in response to the heuristic simulation procedures 30, which comprise simulated operational characteristics as determined by the heuristic simulation procedures, are stored in the simulated operational characteristics level 24F of the first blackboard system 40F. Similarly, the results of a simulation operation performed in response to the computational simulation procedures 31, which comprise simulated operational characteristics as determined by the computational simulation procedures, are stored in the corresponding level of the second blackboard system 40S.

Similar operations occur during the diagnosis phase. During the diagnosis phase, the control module 17 applies analysis rules and diagnostic rules in rule base 15 identified by diagnostic component 12 to perform the analysis segment and the diagnostic segment. The analysis segment of the diagnosis phase is performed in connection with analysis rules 33 identified by an analytical knowledge source 34, and the diagnostic segment is performed in connection with diagnostic rules 35 identified by a diagnostic knowledge source 36. Data structures comprising the analytical knowledge source 34 and diagnostic knowledge source 36 are described below in connection with FIG. 1C.

Generally, during the analysis segment the control module 17 applies the analysis rules 33 identified by the analytical knowledge source 34 to compare the simulated operational characteristics in each blackboard 40F or 40S to the desired operational characteristics blackboard in the same blackboard to determine the discrepancies therebetween. The control module 17 uses some of the analysis rules 33 in connection with the desired operational characteristics stored in level 22F and the simulated operational characteristics stored in level 24F of first blackboard system 40F, and in response thereto generates discrepancy information for storage in discrepancy information level 41F. Similarly, the control module 17 uses others of the analysis rules 33 in connection with the desired operational characteristics and the simulated operational characteristics stored in corresponding levels of second blackboard system 40S, and in response thereto generates discrepancy information for storage in second blackboard system 40S.

Similarly, during the diagnostic segment, the control module 17 applies the diagnostic rules 35 identified by the diagnosis knowledge source 36 to process the discrepancies identified during the analysis segment and the design representation in each blackboard 40F or 40S to determine the causes of the identified discrepancies, which it stores in the same blackboard. The control module 17 uses some of the diagnostic rules 35 in connection with the design representation in level 21F and discrepancy information in level 41F of first blackboard system 40F, and in response thereto generates discrepancy cause information for storage in discrepancy cause information level 42F. Similarly, the control module 17 uses others of the diagnostic rules 35 in connection with the design representation and discrepancy information in levels of second blackboard system 40S, and in response thereto generates discrepancy cause information for storage in second blackboard system 40S.

Following the diagnostic phase, the control module 17 initiates the redesign phase. During the redesign phase, rules in the rule base 15 are used to alter the design representation stored in design representation level 21F of the first blackboard system 40F, or the corresponding level of the second blackboard system 40S. The redesign component 13 includes a plurality of redesign knowledge sources 43A through 43N (generally identified by reference numeral 43), each of which identifies selected ones of a set of eligibility rules 44, redesign operator rules 45 and scheduling rules 46. Each redesign knowledge source 43 is associated with the redesign of a particular aspect of the type of complex system that can be simulated and redesigned by the expert system. The detailed structure of a redesign knowledge source 43 will be described below in connection with FIG. 1E. Further, the redesign knowledge sources 43 and rules relating thereto comprising one particular embodiment of the invention, which is used to simulate and redesign digital electrical circuit networks, particularly related to driver and receiver networks on printed circuit boards, are described below and in connection with the attached Rules Appendix.

The redesign phase includes three stages, namely, an eligibility stage, a selection stage and an application stage. Following the diagnosis phase, the control module 17 initiates the eligibility stage. During the eligibility stage, the control module 17 iteratively applies the eligibility rules 44 identified by each of the redesign knowledge sources 43 to the discrepancy information in the discrepancy information level 41F and to the discrepancy cause information in the discrepancy cause information level 42F of first blackboard system 40F, or the corresponding level of second blackboard system 40S. If the conditions of an eligibility rule are satisfied, an eligibility flag in level 47F in first blackboard system 40F, or in a corresponding level of the second blackboard system 40S, is set identifying the redesign knowledge source 43 that identifies the eligibility rule. If the conditions of an eligibility rule are satisfied by information in the first blackboard system 40F, the eligibility flag is set in the eligibility flags level 47F in the first blackboard system 40F, but if the conditions of an eligibility rule are satisfied by information in the second blackboard system 40S, the eligibility flag is set in a corresponding level of the second blackboard system 40S.

If an eligibility flag identifying a redesign knowledge source 43 is set, that indicates that the redesign knowledge source 43 identifies redesign operator rules 45 and scheduling rules 46 that, when applied to the design representation in design representation level 21F of first blackboard system 40F, or the corresponding level of second blackboard system 40S, will modify the design representation to reduce or eliminate a discrepancy that was identified during the diagnostic phase.

Following the eligibility stage, the control module 17 initiates the selection stage of the redesign phase. During the selection stage, meta rules 50, in rule base 15, identified by a redesign selection knowledge source 51 are used to select one or more redesign knowledge sources 43. In this operation, the control module 17 tests the conditions of the meta rules against the discrepancy information, the discrepancy cause information, the eligibility flags, and design constraints in levels 23F, 41F, 42F and 47F of the first blackboard system 40F, and, if a meta rule's conditions are satisfied, inserts the identification of one redesign knowledge source 43 into a selected knowledge source identification level 52F of first blackboard system 40F. Similarly, the conditions of the meta rules are compared to the discrepancy information, the discrepancy cause information, the eligibility flags, and design constraints in corresponding levels of the second blackboard system 40S, and, if a meta rule's conditions are satisfied, the identification of one redesign knowledge source 43 is inserted into a selected knowledge source identification level (not shown) of second blackboard system 40S.

The meta rules 50 applied during the selection stage may identify multiple redesign knowledge sources 43 in, for example, the first blackboard system 40F. For example, if several discrepancies and discrepancy causes identified during the diagnosis phase are completely disjoint, the meta rules 50 may identify multiple redesign knowledge sources 43, each associated with one of the disjoint discrepancies and discrepancy causes. On the other hand, if several discrepancies and discrepancy causes are related, and are of diverse levels of particularity, the control module may, in response to the meta rules 50, select a redesign knowledge source 51 associated with the discrepancy and discrepancy cause and store the eligibility flag therefor in the level 47F. If the control module 17 stores eligibility flags for multiple redesign knowledge sources 43 in the level 47F during the selection stage, the control module 17 forms multiple copies of the design representation, one for each selected redesign knowledge source 43, in the design representation level 21F and uses one of the redesign knowledge sources 43 in connection with each copy, effectively performing the redesign application stage in connection with each copy of the design representation. Similar operations occur in connection with the second blackboard system 40S.

Following the selection stage, the control module 17 initiates the redesign application stage of the redesign phase. During the redesign application stage, the control module 17 applies the redesign operator rules 45 and scheduling rules 46 identified by a redesign knowledge source 43 identified in the knowledge source identification level 52F in the first blackboard system 40F. If multiple redesign knowledge sources 43 are identified in the knowledge source identification level 52F, the control module 17 applies the redesign operator rules 45 and scheduling rules identified by each separately to one of the copies of the design representation in level 21F. The control module 17 initiates similar operations in connection with redesign knowledge sources 43 identified in the second blackboard system 40S.

In the redesign application stage, for each redesign knowledge source 43 identified by the eligibility flags 47F in first blackboard system 40F, the control module 17 applies the redesign operator rules 45 and scheduling rules 46 identified by the redesign knowledge source 43 to the associated copy of the design representation in the first blackboard system 40F in a series of iterations. During each iteration, the conditions of the identified ones of the redesign operator rules 45 are applied to the design representation in the design representation level 21F and design constraints in design constraints level 23F of blackboard 40F or the corresponding levels of blackboard 40S. If the conditions of only one of the identified redesign operator rules 45 are satisfied, that redesign operator rule fires so as to modify the design representation stored in the design representation level 21F, or in the corresponding level of second blackboard system 40S. During the next iteration, the conditions of the redesign operator rules 45 identified by the selected redesign knowledge source 43 are compared to the then-current design representation, that is, the design representation as modified during the previous iteration, as well as to the constraints stored in the design constraints level.

If the conditions of multiple ones of the identified redesign operator rules 45 are satisfied, the scheduling rules 46 identified by the selected redesign knowledge source 43 are used to select one of the identified redesign operator rules 45. Thus, the scheduling rules operate to perform a conflict resolution operation. The conditions of the scheduling rules identify various combinations of redesign operator rules, and thus the scheduling rules will only fire, to identify one of the redesign operator rules, if the conditions of multiple redesign operator rules are satisfied. Thus, it will be appreciated that the scheduling rules 46, identified by the rules associated with the selected redesign knowledge source 43, may be applied during each iteration, but will only fire if the conditions of multiple ones of the identified redesign operator rules 45 are satisfied.

When the conditions of none of the identified redesign operator rules 45 are satisfied, the redesign application stage is concluded. The control module 17 repeats the redesign application stage for each selected redesign knowledge source 43 separately in connection with each copy of the design representation in the level 21F of first blackboard system 40F or the corresponding level of second blackboard system 40S. After the redesign application stage has been performed for each of the redesign knowledge sources 43, the control module 17 notifies the operator, through the user interface 10. If, during the selection stage of the redesign phase, multiple copies of the design representation were produced, the control module 17 may present them to the operator, who may select one of the design representation for future use. The operator, at this point, may use the selected design representation, or he or she may enable the expert system to perform another sequences of simulation, diagnostic and redesign phases therewith, either as produced by the expert system or with modifications provided by the operator.

It will be appreciated that, providing heuristic simulation, and associated redesign, which can be performed relatively rapidly, permits quick rough redesign operations to be performed in connection with a circuit to obtain a circuit design whose operation generally corresponds to the operation as desired by the circuit operator. The circuit design can thereafter be refined to more closely correspond to the desired operation through slower low-level simulation and redesign operations.

Furthermore, since the two operational levels, namely, the high-level operation and the low-level operation, are relatively independent, the processing of information stored in the first blackboard system 40F and of information stored in the second blackboard system 40S, can take place concurrently, speeding up processing.

Providing all of the rules, and, in particular, the redesign operator rules 45 and scheduling rules 46 in the common rule base 15, with pointers thereto in the various redesign knowledge sources 43 in redesign component 14, also provides a number of advantages. First, providing common redesign operator rules 45 and scheduling rules 46 facilitates sharing of particular rules in connection with the redesign knowledge sources 43, so that they do not have to be replicated if multiple ones of the redesign knowledge sources reference them. Furthermore, providing redesign knowledge sources 43 facilitates orderly construction and maintenance of the expert system. First, since each of the redesign knowledge sources 43 is associated with redesign of a particular aspect of the complex system, providing the redesign knowledge sources 43 facilitates ensuring that the expert system includes facilities directed to all of the aspects required to perform required redesign operations.

With this background, the detailed structure of the various knowledge sources depicted in FIG. 1A will be described in connection with FIGS. 1B through 1E, the rules will be described in connection with the Rules Appendix attached hereto, and the details of the operations performed by the expert system will be described in connection with FIGS. 2A through 3B-2.

FIG. 1B depicts the data structure which comprises both the heuristic simulator knowledge source 26 (FIG. 1A) and the computational simulator knowledge source 27, the data structure in FIG. 1B being identified by reference numeral 60. With reference to FIG. 1B, the data structure 60 comprises an attributes block 61 including three entries, including a source level identification entry 62, a destination level identification entry 59, and a pointer entry 63. The control module 17 uses the source level identification entry 62 to provide a value that identifies the one of the eight level, that is, the one of levels 21F, 22F, 23F, 24F, 4lF, 4lF, 47F or 52F within blackboard 40F, or the corresponding level in blackboard 40S, from which information will be retrieved for processing the simulation procedures identified by the contents of pointer entry 63. The control module 17 uses the destination level identification entry 59 to provide a value that identifies the level in blackboard 40F or 40S into which processed information, resulting from processing of the simulation procedures, will be stored. Normally, the control module 17 will enable the heuristic simulation procedures 30 to use information retrieved from, and to store processed information in, the design representation level 21F of the first blackboard system 40F. In addition, normally, the control module 17 will enable the computational simulation procedures 31 to use information retrieved from, and to store processed information in, the corresponding design representation level (not shown) of second blackboard system 40S.

The procedure pointer 63 of the data structure 60 points to procedures in the procedure base 14 for performing the simulation during the simulation phase. Thus, in the heuristic simulator knowledge source 26, the procedure pointer 63 points to the heuristic simulation procedures 30 used in performing heuristic simulation operations required for the subsequent operations of the expert system. Similarly, in the computational simulator knowledge source 27, the procedure pointer 63 points to the computational simulation procedures 31, which in one embodiment comprise the SPICE simulation procedures, that are used in performing the computational simulation operations required for the subsequent operations of the expert system. The control module 17 uses the procedure pointer 63 to identify the particular heuristic simulation procedures 30 during the simulation phase after the operator has loaded a design representation into the design representation level 21F or the computational simulation procedures 31 after the operator has loaded a design representation into the corresponding design representation level of the second blackboard system 21S.

FIG. 1C depicts the data structure 65 comprising both the analytical knowledge source 34 and the diagnostic knowledge source 36 of the diagnostic component 12. With reference to FIG. 1C, the data structure 65 includes an attributes block 66 that includes a source level identification entry 67, a destination level identification entry 68, and a rule pointer entry 70 that identifies a first-level rule list 71. The attributes block 66 also includes a second source level identification entry 72, a second destination level identification entry 69 and a second rule pointer 73, that identifies a second-level rule list 74. The control module 17 uses the first-level rule list 71 to identify the analysis rules 33 in rule base 15 that are used in analyzing the discrepancy information stored in discrepancy information level 41F of blackboard 40F, and the second-level rule list 74 to identify the analysis rules in rule base 33 that are used in analyzing the discrepancy information stored in the corresponding level of blackboard 40S. The control module 17 uses the contents of the source level identification entry 67 and destination level identification entry 68 to identify the level of the blackboard, in either the first blackboard system 40F containing the information used in processing the analysis rules identified by the analysis knowledge source 34, and the contents of the destination level identification entry 68 identify the level of first blackboard system 40F in which information resulting from firing of the rules is to be stored. The contents of entries 72, 69 and 73 of attributes block 66 are similar.

FIG. 1D depicts the data structure 75 of the redesign select knowledge source 51 in the redesign component 13. With reference to FIG. 1D, the data structure 75 includes an attributes block 76 that includes a source level identification entry 77, a destination level identification entry 79, and a rule pointer entry 70 that identifies a first-level meta rule list 80. The attributes block 76 also includes a second source level identification entry 81, a second destination level identification entry 58 and a second rule pointer 82, that identifies a second-level meta rule list 83. The control module 17 uses the first-level meta rule list 80 to identify the meta rules 50 in rule base 15 that are used in selecting redesign knowledge sources whose eligibility flags may be stored in level 47F of first blackboard system 40F, and the second-level meta rule list 80 to identify the meta rules 50 that are used in selecting redesign knowledge sources whose eligibility flags may be stored in the corresponding level of second blackboard system 40S. The control module uses the contents of the source level identification entry 77 and destination level identification entry 79 to identify the level of the first blackboard system 40F which supplies the information used in processing the analysis rules identified by the analysis knowledge source 34, and the contents of the destination level identification entry 79 to identify the level of first blackboard system 40F in which information resulting from firing of the rules is to be stored. The contents of entries 81, 58 and 82 of attributes block 76 are similar.

Finally, FIG. 1E depicts the data structure 84 of a redesign knowledge source 43. The data structure 84 includes an attributes block 85 that includes a plurality of entries, including a source level identification entry 86, a destination level identification entry 89 and three rule pointer list entries 87, 90 and 92. The control module 17 uses a redesign rule list pointer 87 to identify a redesign rule list 88. The redesign rule list 88, in turn, includes one or more pointers each of which is used by the control module 17 to identify one of the redesign operator rules 45 in rule base 15. A scheduling rule list pointer 90 points to a scheduling rule list 91 that may include one or more entries, and the control module 17 uses each entry in the scheduling rule list 91 to identify one of the scheduling rules 46 of the rule base 15. Similarly, an eligibility rule list pointer 92 points to an eligibility rule list 93 that includes one or more pointers that the control module 17 uses to identify one of the eligibility rules 44 in the rule base 15. The control module 17 uses the source level identification entry 86 to identify the level or levels of blackboard 40F or 40S which contains information used in connection with processing of the rules, and the destination level identification entry 89 to identify the level or levels of blackboard 40F or 40S into which information resulting from firing of a rule is stored.

The procedure base 22 may contain one or more procedures each defining a sequence of operations to be taken. The operations may specify operations to be taken in connection with the facts in the working memory 12, such as adding, deleting or modifying selected facts, may specify that messages be delivered to the operator through the computer's input/output element, and may also specify selected control actions, such as initialization or termination of operation, to be taken in connection with the operation of the system.

The particular procedures in procedure base 14 depend on the nature of the particular object being designed, simulated and redesigned. In one embodiment of the invention, which is used in connection with design of a digital electrical circuit network, the heuristic simulation procedures 30 and the computational simulation procedures 31 in procedure base 14 will depend on the circuit elements to be simulated. In one specific embodiment, the computational simulation procedures comprise SPICE, a well-known simulation system.

The rule base 21 contains one or more production rules. A production rule typically comprises two parts, including a condition level and an action, or consequent, level. Briefly, the condition level, which is also known as the "left-hand side", sets forth one or more conditions. Each condition relates to one or more of facts which may be stored in the blackboard 12, so that, if the facts in the blackboard 12 indicate that the conditions are satisfied, the rule is said to "fire". If a rule fires, the actions specified in the action level are performed, as a result of which facts on the blackboard 12 may be modified, may be added to or deleted from the blackboard 12. Additionally, actions identified in the action level of a rule may specify that a message be delivered to the operator through the user interface 10. Furthermore, the actions may specify that selected control actions, such as initialization or termination of operation, be taken concerning the operation of the system.

The particular rules in rule base 15 also will depend on the nature of the particular object being designed, simulated and redesigned. In connection with that same embodiment of the invention, which is used in connection with the design of a digital electrical circuit network, such as described in Simoudis "A Knowledge Based System For The Evaluation And Redesign Of Digital Circuit Networks", the rules are attached hereto as a Rules Appendix. With reference again to FIG. 1, knowledge sources 34 and 36 comprising the diagnostic component 12 point to two types of rules, namely, analysis rules and diagnostic rules. The analysis rules have left hand sides, or conditions, which are compared to the simulated operational characteristics provided by the simulation component 13 and the desired operational characteristics provided by the operator. The right-hand sides, or conclusions, of the analysis rules provide the discrepancy identifications which are stored in the level 41F of first blackboard system 40F or a corresponding level of second blackboard system 40S. If, during operation of the expert system depicted in FIG. 1, an analysis rule fires, the conclusion noted in the right-hand side of the analysis rule is entered into the level 41F of blackboard 40F, or the corresponding level of blackboard 40S, as identified by the destination level identification pointer 68 or 69.

In the diagnostic rules, the left hand sides are compared to the discrepancy identifications generated in response to the analysis rules and the design representation 11, and the right-hand sides provide the discrepancy cause identifications, which are stored in level 42F of blackboard 40F, or the corresponding level of blackboard 40S, to identify the causes of the discrepancies identified by the right-hand sides of the analysis rules.

The eligibility rules depicted in the Appendix are identified as being associated with particular redesign knowledge sources 43 and are used during the eligibility phase. The left hand side of each eligibility rule identifies both a discrepancy identification and a discrepancy cause identification, and when the rule fires, the right hand side enables the redesign knowledge source's eligibility flag to be conditioned to identify the redesign knowledge source. The flag is conditioned in the eligibility flags level 47F of the first blackboard system 40F or the corresponding level of the second blackboard system 40S, as determined by the destination level identification entry 89 of the redesign knowledge source's data structure 84.

The meta rules depicted in the Rules Appendix are all used during the redesign knowledge source selection phase. The conditions set forth in the left-hand sides include such elements as a discrepancy identification and a discrepancy cause identification, the identifications of one or more redesign knowledge sources 438, and, in some cases, the identification of one or more design constraints. The discrepancy identification in a meta rule is compared to the contents of the first-level discrepancy information level 41F of first blackboard system 40F, or the corresponding level in the second blackboard system 40S, depending on whether the meta rule is identified by a pointer on the first-level meta rule list 80 or the second-level meta rule list 83, and the contents of the destination level identification entries 79 and 58. The identifications of the redesign knowledge sources 43 in a meta rule are compared to the identifications of the redesign knowledge sources 43 whose eligibility flags are set in the first-level eligibility flag level 47F in first blackboard system 40F, or the corresponding level in second blackboard system 40S. Finally, the constraints in a meta rule are compared to the contents of the design constraints level 23F of first blackboard system 40F, or the corresponding level of second blackboard system 40S, depending on whether the meta rule is identified by a pointer on the first-level meta rule list 80 or the second-level meta rule list 83, and the contents of the destination level identification entries 79 and 58. The right-hand side of a meta rule identifies a redesign knowledge source 43 whose identification is inserted into the selected knowledge source identification level 30 or the corresponding level in the second-level level 24B.

The redesign operator rules 45, identified in the Rules Appendix as "Redesign Operators", are used to perform redesign operations in connection with the design representation 21F in first blackboard system 40F, or the corresponding level of second blackboard system 40S. As a result of processing in response to a redesign operator rule, an element of the design may be deleted, added, or modified. The scheduling rules 46 are provided if the conditions of multiple redesign operator rules are satisfied simultaneously, to select one of the redesign operator rules for firing.

FIGS. 2A through 3B-2 contain flow diagrams detailing the operations of the expert system depicted in FIG. 1. The flow diagrams detail the operations of the expert system as described above, and so they will not be described in detail.

As noted above, one specific embodiment of the invention, described in the above-identified Simoudis paper, is used in connection with the design, simulation and redesign of digital electrical circuit networks, specifically relating to networks of drivers and receivers on printed circuit boards. The structure of heuristic simulation procedures 30 therefor will be apparent to those skilled in the art, and the computational simulation procedures 31, which in one embodiment comprise a SPICE computer program, are also will known to those skilled in the art. The embodiment includes fourteen redesign knowledge sources 43, including:

| Redesign Knowledge Source | Blackboard system |
| --- | --- |
| Change Terminator | First |
| Change Driver | First, Second |
| Add Another Driver | First |
| Change Receiver | First, Second |
| Reduce Transmission Line Length | First, Second |
| Remove Receivers | First, Second |
| Increase Zeff | Second |
| (Zeff = effective impedance) | |
| Move Branch | Second |
| Break Branch | Second |
| Balance Impedance | Second |

In the above list, the named redesign knowledge sources associated with both the first and second blackboard systems 40F and 40S comprise two redesign knowledge sources 43 (FIG. 1), one for each blackboard system, having the same name. The Rules Appendix contains rules comprising the analysis rules 33, diagnosis rules 35, eligibility rules 44, redesign operator rules 45, scheduling rules 46 and meta rules 50 used in the embodiment. The Rules Appendix also identifies the particular eligibility rules 44 and redesign operator rules 45 associated with each of the redesign knowledge sources 43 in that embodiment. In that embodiment, all of the scheduling rules 46 are associated with, and used by the control module 17 for, all of the redesign knowledge sources 43.

The foregoing description has been limited to a specific embodiment of this invention. It will be apparent, however, that variations and modifications may be made to the invention, with the attainment of some or all of the advantages of the invention. For example, While the invention has been described in terms of having only two types of simulation procedures, and associated blackboard systems, it will be appreciated that any number of types of simulation procedures, and associated blackboard system, may be provided. Similarly, while the knowledge sources comprising the simulation component 11 have been described as identifying procedures in a procedure base 14 and the knowledge sources comprising the diagnostic component 12 and redesign component 13 have been described as identifying rules in a rule base 15, it will be appreciated that the knowledge sources may identify any combination of procedures and/or rules. Therefore, it is the object of the appended claims to cover all such variations and modifications as come within the true spirit and scope of the invention.

What is claimed as new and desired to be secured by Letters Patent of the United States is:

RULES APPENDIX

Analysis Rules

The following rules belong to the analysis knowledge source of the first blackboard based system; namely, the one which performs the high level evaluation and design IF the technology of the circuit is fttl
AND the current in the high or low state is >0
AND the current in the low are high state is >0
THEN signal strength problem.

IF the technology of the circuit is fttl
AND the current in the high to low state is <0
AND the current in the low to high state is <0
THEN signal strength problem.

IF the technology of the circuit is fttl
AND the current in the high to low state is >0
AND the current in the low to high state is <0
THEN signal strength problem.

IF the technology of the circuit is fttl
AND all the receivers in the circuit violate the propagation delay constraint in the high to low state
THEN propagation delay problem.

IF the technology of the circuit is fttl
AND one receiver in the circuit violates the propagation delay constraint in the high to low state
THEN propagation delay problem.

IF the technology of the circuit is fttl
AND two of the receivers in the circuit violate the propagation delay constraint in the high to low state
THEN propagation delay problem.

IF the technology of the circuit is fttl
AND all the receivers in the circuit violate the propagation delay constraint in the low to low state
THEN propagation delay problem.

IF the technology of the circuit is fttl
AND one receiver in the circuit violates the propagation delay constraint in the low to high state
THEN propagation delay problem.

IF the technology of the circuit is fttl
AND two of the receivers in the circuit violate the propagation delay constraint in the low to high state
THEN propagation delay problem.

IF the technology of the circuit is fttl
AND the number of receivers which violate the user's propagation delay constraint is more than 2 but less than the total number of receivers in the circuit
THEN propagation delay problem.

The following rules belong to the analysis knowledge source of the second blackboard based system; namely, the one which performs the detailed evaluation and redesign.

IF the waveform of a receiver has reflections either between the two technology voltage thresholds or below the low technology threshold
AND are examining the high to low transition of the wave
THEN propagation delay problem.

IF the waveform of a receiver has reflections either between the two technology voltage thresholds or above the high technology voltage threshold
AND we are examining the low to high signal transition of the waveform
THEN propagation delay problem.

IF the waveform receiver has a plateau between the two technology voltage thresholds
AND we are examining the high to low transition of the waveform or the low to high transition of the waveform
THEN propagation delay problem.

IF the time the waveform crosses the low voltage technology threshold minus the last simulated time of the circuit is less than the circuit driver's rise time
AND we are examining the low to high transition of the waveform
THEN propagation delay problem.

IF the time the waveform crosses the high voltage technology threshold minus the last simulated time of the circuit driver's fall time
AND we are examining the high to low transition of the waveform
THEN propagation delay problem.

IF the time the waveform crosses the high voltage technology technology minus the last simulated time of the circuit is greater than the circuit driver's fall time
AND we are examining the high to low transition of the waveform
THEN rc problem.

IF the time the waveform crosses the low voltage technology threshold minus the last simulated time of the circuit driver's rise time
AND we are examining the low to high transition of the waveform
THEN rc problem.

Diagnostic Rules

The following rules belong to the diagnosis knowledge source of the first blackboard based system; namely, the one which performs the high level evaluation and redesign IF there exists a signal strength problem
AND the circuit does not have a terminator
THEN the terminator is the cause of the problem.

IF there exists a signal strength problem
AND the circuit has only one driver
THEN the driver is the cause of the problem.

IF there exists a signal strength problem

AND the circuit has at least two drivers
THEN the problem is due to the receivers IF there exists a propagation delay problem
THEN the last receiver of the circuit is the cause of the problem IF there exists a propagation delay problem
THEN the cause of the problem is the impedance of the transmission line which connects the driver of the circuit to the last receiver The following rules belong to the diagnosis knowledge source of the second blackboard based system; namely, the one which performs the detailed evaluation and redesign IF there is a propagation delay problem
AND the circuit has a cluster of receivers
THEN the problem is due to the cluster.

IF there is a propagation delay problem
AND the circuit has a branch
THEN the problem is due to this branch.

IF there is a propagation delay problem
AND there is an impedance discontinuity in the etches of the circuit
THEN the problem is due to this discontinuity.

IF there is a propagation delay problem
AND there is a change in the effective impedance of the circuit at some place in the circuit
THEN the problem is due to the change of the effective impedance.

IF there is a propagation delay problem
AND the impedance of the circuit's driver is greater than the effective impedance of the circuit
THEN the problem is due to the driver.

IF there is a rc problem
AND the impedance of the circuit's driver is greater than the effective impedance of the circuit
THEN the problem is due to the driver.

IF there is propagation delay problem
AND it is due to the driver
AND the circuit has many drivers
THEN implicate the first driver unless it has been exonerated.

IF there is a propagation delay problem
AND it is due to impedance discontinuity
AND there are more than one place in the circuit where the impedance is discontinued
THEN ask the user to choose which of the places will be considered responsible.

IF there is a propagation delay problem
AND it is due to the existence of a branch
AND there are more than one branch responsible for the problem
THEN ask the user to choose which of the branches will be considered the most responsible.

IF there is arc problem
AND it is due to the driver
AND the circuit has many drivers
THEN implicate the first driver unless it has been exonerated.

Eligibility rules to redesign knowledge sources

The following eligibility rules belong to the redesign knowledge source called "change terminator"
IF there is a signal strength problem
AND the cause is the terminator
THEN the knowledge source "change terminator" is eligible.

(belongs to the first blackboard based system)

The following eligibility rules belong to the redesign knowledge source called "change driver"

IF there is a signal strength problem
AND the cause of the problem is the driver
THEN the knowledge source "change driver" is eligible.

(belongs to the first blackboard based system)

IF there is a propagation delay problem
AND the cause is the impedance of the driver
THEN the knowledge source "change driver" is eligible.

(belongs to the first blackboard based system)

IF there is a rc problem
AND the cause of the problem is one of the circuit's drivers
THEN the knowledge source "change driver" is eligible.

(belongs to the second blackboard based system)

The following eligibility rules belong to the redesign knowledge source called "add another driver"

IF there is a signal strength problem
AND the cause of the problem is the driver
THEN the knowledge source "add another driver" is eligible.

(belongs to the first blackboard based system)

IF there is a propagation delay problem
AND the cause is the impedance of the driver
THEN the knowledge source "add another driver" is eligible.

(belongs to the first blackboard based system)

The following eligibility rules belong to the redesign knowledge source called "change receiver"

IF there is a signal strength problem
AND the cause of the problem is due to the receivers in the circuit
THEN knowledge source "change receiver" is eligible.

(belongs to the first blackboard based system)

IF there is a propagation delay problem

AND the cause of the problem is due to the existence of a branch in the circuit
THEN the knowledge source "change receiver" is eligible.

(belongs to the second blackboard based system)

IF there is a propagation delay problem
AND the cause of the problem is due to the capacitance of a cluster of receivers
THEN the knowledge source "change receiver" is eligible.

(belongs to the second blackboard based system)

The following eligibility rules belong to the redesign knowledge source called "reduce transmission line length"

IF there is a propagation delay problem
AND the cause of the problem is the impedance of the transmission line which connects the driver of the circuit to the last receiver
THEN the knowledge source "reduce transmission line length" is eligible.

(belongs to the first blackboard based system)

IF there is a propagation delay problem
AND the cause of the problem is due to the capacitance of a cluster of receivers
THEN the knowledge source "reduce transmission line length" is eligible.

(belongs to the second blackboard based system)

IF there is a propagation delay problem
AND the cause of the problem is due to the existence of a branch in the circuit
THEN the knowledge source "reduce transmission line length" is eligible.

(belongs to the second blackboard based system)

The following eligibility rules belong to the redesign knowledge source called "remove receivers"

IF there is a propagation delay problem
AND the cause of the problem is due to the capacitance of a cluster of receivers
THEN the knowledge source "remove receivers" is eligible.

(belongs to the second blackboard based system)

IF there exists a propagation delay problem
AND the cause of the problem is due to the last receiver of the circuit
THEN the knowledge source "remove receivers" is eligible.

(belongs to the first blackboard based system)

The following eligibility rules belong to the redesign knowledge source called "increase zeff"

IF there is a propagation delay problem
AND the cause of the problem is due to a change in the effective impedance of the circuit
THEN the knowledge source "increase zeff" is eligible.

(belongs to the second blackboard based system)

IF there is a propagation delay problem
AND the cause is the impedance of the driver
THEN the knowledge source "increase zeff" is eligible.

(belongs to the second blackboard based system)

The following eligibility rules belong to the redesign knowledge source called "move branch"

IF there is a propagation delay problem
AND the cause of the problem is due to the existence of a branch in the circuit
THEN the knowledge source "move branch" is eligible.

(belongs to the second blackboard based system)

The following eligibility rules belong to the redesign source called "break branch"

IF there is a propagation delay problem
AND the cause of the problem is due to the existence of a branch in the circuit
THEN the knowledge source "break branch" is eligible.

(belongs to the second blackboard based system)

The following eligibility rules belong to the redesign knowledge source called "balance impedance"

IF there is a propagation delay problem
AND the cause of the problem is due to impedance discontinuity
THEN the knowledge source "balance impedance" is eligible.

(belongs to the second blackboard based system)

IF the value of a driver'attribute needs to be changed
THEN invoke the procedure which calculates the new value
AND change the value of the attribute to the value returned by the procedure (belongs to the redesign knowledge sources: change driver, balance impedance, change zeff)

IF the value of the driver's attribute needs to be changed
THEN invoke the procedure which calculates the new value
AND change the value of the attribute to the value returned by the procedure (belongs to the redesign knowledge sources: change receiver)

IF the value of a piece of etch's attribute needs to be changed
THEN invoke the procedure which calculates the new value AND change the value of the attribute to the value
   returned by the procedure (belongs to the redesign knowledge sources: reduce
transmission line length, balance impedance change
zeff)

IF the value of a connector's attribute needs to be
   changed
THEN invoke the procedure which calculates the new
   value
AND change the value of the attribute to the value
   returned by the procedure (belongs to the redesign knowledge sources, reduce
transmission line lengths balance impede change zeff)

IF the value of a via's attribute needs to be changed
THEN invoke the procedure which calculates the new
   value
AND change the value of the attribute to the value
   returned by the procedure (belongs to the redesign knowledge sources: change
driver)

IF the terminator is connected to a piece of etch
AND the etch is connected to another piece of transmission line which only has a transmission line connected to it
THEN remove the terminator from the circuit
AND mark the second transmission line (belongs to the redesign knowledge sources: change
terminator)

IF there is floating terminator
AND a marked transmission line
THEN connect the terminator to the transmission line (belongs to the redesign knowledge sources: change
terminator)

IF the user has specified the amount of length that has
   to be removed from an etch
THEN shorten the etch's length (belongs to the redesign knowledge sources: reduce
transmission line length, balance impedance, increase
zeff)

IF the length of a piece of etch is 0
THEN remove the piece of each (belongs to the redesign knowledge sources: reduce
transmission line length, balance impedance, increase
zeff)

IF the copy of a driver has to be made
THEN make an instance of the driver object
AND copy the value of the attributes of the driver
   which serves as the prototype (belongs to the redesign knowledge sources: remove
receivers, add another driver)

IF the copy of a piece of etch has to be made
THEN make an instance of the etch object
AND copy the values of the attributes of the piece of
   etch which serves as a prototype (belongs to the redesign knowledge sources: remove
receivers, add another driver)

IF the copy of a connector has to be made
THEN make an instance of the connector object
AND copy the values of the attributes of the connector
   which serves as the prototype (belongs to the redesign knowledge sources: remove
receivers, add another driver)

IF the copy of a via has to be made
THEN make an instance of the via object
AND copy the values of the attributes of the via which
   serves as the prototype (belongs to the redesign knowledge sources: remove
receivers, add another driver)

IF the copy of a terminator has to be made
THEN make an instance of the terminator object
AND copy the values of the attributes of the terminator
   which serves as the prototype (belongs to the redesign knowledge sources: remove
receivers, change terminator)

IF the value of a driver's attribute needs to be changed
THEN invoke the procedure which calculates the new
   value
AND change the value of the attribute to the value
   returned by the procedure (belongs to the redesign knowledge sources; change
driver, balance impedance, change zeff)

IF the value of a receiver's attribute needs to be
   changed
THEN invoke the procedure which calculates the new
   value
AND change the value of the attribute to the value
   returned by the procedure (belongs to the redesign knowledge sources; change
receiver)

IF the value of a piece of etch's attributes needs to be
   changed
THEN invoke the procedure which calculates the new
   value
AND change the value of the attribute to the value
   returned by the procedure (belongs to the redesign knowledge sources; reduce
transmission line length, balance impedance, change
zeff)

IF the value of a connector's attribute needs to be
   changed
THEN invoke the procedure which calculates the new
   value
AND change the value of the attribute to the value
   returned by the procedure (belongs to the redesign knowledge sources; reduce transmission line length, balance impedance, change zeff)

IF the value of a via's attribute needs to be changed
THEN invoke the procedure which calculates the new value
AND change the value of the attribute to the value returned by the procedure IF the value of a terminator's attribute needs to be changed
THEN invoke the procedure which calculates the new value
AND change the value of the attribute to the value returned by the procedure (belongs to the redesign knowledge sources: reduce transmission line length, balance impedance, change zeff)

IF a driver needs to be connected to the circuit
AND the driver has been removed from a different part of the circuit
THEN connect the driver to the copy of the element to which it was previously connected (belongs to the redesign knowledge sources: remove receives)

IF a receiver needs to be connected to the circuit
AND the receiver has been removed from a different part of the circuit
THEN connect the receiver to the copy of the element to which it was previously connected (belongs to the redesign sources: remove receivers, break branch, move branch)

IF a piece of etch needs to be connected to the circuit
AND the piece of etch has been removed from a different part of the circuit
THEN connect the piece of etch to the copy of the element to which is was previously connected (belongs to the redesign knowledge sources: remove receivers, break branch, move branch)

IF a connector needs to be connected to the circuit
AND the connector has bee removed from a different part of the circuit
THEN connect the connector to the copy of the element to which it was previously connected (belongs to the redesign knowledge sources: remove receivers, break branch, move branch)

IF a via needs to be connected to the circuit
AND the via has been removed from a different part of the circuit
THEN connect the via to the copy of the element to which is was previously connected (belongs to the redesign knowledge sources: remove receivers, break branch, move branch)

IF a terminator needs to be connected to the circuit
AND the terminator has been removed from a different part of the circuit
THEN connect the terminator to the copy of the element to which it was previously connected (belongs to the redesign knowledge sources: remove receivers)

IF a circuit driver needs to be retrieved from the circuit component database
THEN form a query with the following specifications:
retrieve a driver either with iolmax.
greater than the iolmax of the present driver of the circuit or with
iohmin less than the iohrim of the present driver of the circuit (belongs to the redesign knowledge sources: remove receivers, change driver)

IF a circuit receiver needs to be retrieved from the circuit component database
THEN form a query with the following specifications:
retrieve a receiver with iihmin less
than the iihmin of some designated receiver, or with iilmax greater
than the iilmax of some designated receiver.

(belongs to the redesign knowledge sources; change receiver)

Meta Rules

IF there exists a propagation delay problem
AND the problem is due to the impedance of the driver
AND the knowledge source "change driver" is eligible
AND the knowledge source "add another driver" is eligible
AND the knowledge source "increase zeff" is eligible
AND there exists area constraints on the pc board
AND there are no cost constraints
THEN prefer the knowledge source "change driver"

IF there exists a propagation delay problem
AND the problem is due to the impedance of the driver
AND the knowledge source "change driver" is eligible
AND the knowledge source "add another driver" is eligible
AND the knowledge source "increase zeff" is eligible
AND there exist area constraints on the pc board
AND there exist cost constraints
THEN prefer the knowledge source "increase zeff"

IF there exists a propagation delay problem
AND the problem is due to the impedance of the driver
AND the knowledge source "change driver" is eligible
AND the knowledge source "add another driver" is eligible
AND the knowledge source "increase zeff" is eligible
AND there are no area constraints on the pc board
AND there are not cost constraints
THEN prefer the knowledge source "add another driver"

IF there exits a propagation delay problem
AND the problem is due to the impedance of the driver
AND the knowledge source "change driver" is eligible
AND the knowledge source "add another driver" is eligible AND the knowledge source "increase zeff" is eligible
AND there are no area constraints on the pc board
AND there exist cost constraints
THEN prefer the knowledge source "increase zeff"

IF there exists a signal strength problem
AND the cause of the problem is due to the driver
AND the knowledge source "change driver" is eligible
AND the knowledge source "add another driver" is eligible
AND there are no area constraints on the pc board
AND there are no cost constraints
THEN prefer the knowledge source "add another driver"

IF there exists a signal strength problem
AND the cause of the problem is due to the driver
AND the knowledge source "change driver" is eligible
AND the knowledge source "add another driver" is eligible
AND there exist area constraints on the pc board
AND there are not cost constraints
THEN prefer the knowledge source "change driver"

IF there exists a propagation delay problem
AND the cause of the problem is due to the existence of a branch in the circuit
AND the knowledge source "change receiver" is eligible
AND the knowledge source "move branch" is eligible
AND the knowledge source "break branch" is eligible
AND there exist area constraints on the pc board
AND there are no cost constraints
THEN the knowledge source "change receiver" is eligible IF there exists a propagation delay problem
AND the cause of the problem is due to the existence of a branch in the circuit
AND the knowledge source "change receiver" is eligible
AND the knowledge source "move branch" is eligible
AND the knowledge source "break branch" is eligible
AND there exist cost constraints
AND there exist area constraints on the pc board
THEN the knowledge source "break branch" is eligible IF there exists a propagation delay problem
AND the cause of the problem is due to the existence of a branch in the circuit
AND the knowledge source "change receiver" is eligible
AND the knowledge source "move branch" is eligible
AND the knowledge source "break branch" is eligible
AND there exist cost constraints
AND there are no area constraints on the pc board
THEN prefer the knowledge source "move branch"

IF there exist a propagation delay problem
AND the cause of the problem is due to the existance of a branch in the circuit
AND the knowledge source "change receiver" is eligible
AND the knowledge source "move branch" is eligible
AND the knowledge source "break branch" is eligible
AND there are no cost constraints
AND there are no area constraints on the pc board
THEN prefer the knowledge source "change receiver"

IF there exists a propagation delay problem
AND the cause of the problem is due to the capacitance of a cluster of receivers
AND the knowledge source "reduce transmission line length" is eligible
AND the knowledge source "remove receivers" is eligible
AND the knowledge source "change receiver" is eligible
AND there exist area constraints on the pc board
AND there are no cost constraints
THEN prefer the knowledge source "change receiver"

IF there exists a propagation delay problem
AND the cause of the problem is due to the capacitance of a cluster of receivers
AND the knowledge source "reduce transmission line length" is eligible
AND the knowledge source "remove receivers" is eligible
AND the knowledge source "change receiver" is eligible
AND there are no area constraints on the pc board
AND there exist cost constraints
THEN prefer the knowledge source "remove receivers"

IF there exists a propogation delay problem
AND the cause of the problem is due to the capacitance of a cluster of receivers
AND the knowledge source "reduce transmission line length" is eligible
AND the knowledge source "remove receivers" is eligible
AND the knowledge source "change receiver" is eligible
AND there exist area constraints on the pc board
AND there exist cost constraints on the pc board
THEN prefer the knowledge source "reduce transmission line length"

Scheduling rules

IF the operator which removes a receiver is eligible
AND the operator which removes a piece of etch is eligible
THEN prefer the operator which removes a receiver IF the operator which removes a receiver is eligible
AND the operator which removes a connector is eligible
THEN prefer the operator which removes a receiver IF the operator which removes a receiver is eligible
AND the operator which removes a via is eligible
THEN prefer the operator which removes a receiver IF the operator which removes a receiver is eligible
AND the operator which removes a terminator
THEN prefer the operator which removes a receiver IF the operator which connects a receiver is eligible
AND the operator which connects a piece of etch is eligible
THEN prefer the operator which connects a piece of etch IF the operator which connects a receiver is eligible AND the operator which connects a connector is eligible
THEN prefer the operator which connects a connector IF the operator which connects a receiver is eligible
AND the operator which connects a via is eligible
THEN prefer the operator which connects via IF the operator which connects a receiver is eligible
AND the operator which connects a terminator is eligible
THEN prefer the operator which connects a terminator IF the operator which connects a driver is eligible
AND the operator which connects a piece of etch is eligible
THEN prefer the operator which connects a piece of each IF the operator which connects a driver is eligible
AND the operator which connects a connector is eligible
THEN prefer the operator which connects a connector IF the operator which connects a driver is eligible
AND the operator which connects a via is eligible
THEN prefer the operator which connects a via IF the operator which connects a driver is eligible
AND the operator which connects a terminator is eligible
THEN prefer the operator which connects a terminator

What is claimed as new and desired to be secured by Letters Patent of the United States is:

1. An expert system for performing a redesign operation in connection with an original design comprising:
   A. a memory including a plurality of blackboards each for storing a design representation and desired operational characteristics of said design;
   B. a simulation component comprising a plurality of simulators each for generating simulated operational characteristics in connection with a design representation on one of said blackboards;
   C. a diagnostic component for identifying operational discrepancies between the simulated operational characteristics and the desired operational characteristics and for identifying the causes of the operational discrepancies; and
   D. a redesign component for generating a redesign of said design representation on said blackboards in response to the identified discrepancies and discrepancy causes.

2. The expert system of claim 1 wherein one of said simulators generates simulated operational characteristics having different degrees of particularity than those operational characteristics generated by another said simulator.

3. The expert system of claim 1 wherein said simulation component generates simulated operational characteristics of a redesign created by said redesign component and wherein said diagnostic component identifies operational discrepancies between said simulated operational characteristics of said redesign and said desired operational characteristics and identifies the causes of said discrepancies.

4. The expert system of claim 3 wherein said simulated operational characteristics of said redesign have a degree of particularity that differs from said simulated operational characteristics of said design representation.

5. The expert system of claim 3 wherein said redesign component generates a redesign of said redesign in response to the identified discrepancies between said simulated operational characteristics of said redesign and said discrepancy causes.

6. The expert system of claim 1 wherein said redesign component generates a redesign for said design representation stored in each of said blackboards.

7. The expert system of claim 1 wherein said diagnostic component and said redesign component each comprise a plurality of knowledge sources, each of said knowledge sources defining one or more selected operations.

8. The expert system of claim 7 wherein each of said selected operations corresponds to a predetermined simulator.

9. The expert system of claim 1 wherein said design is an electronic circuit.

10. A method for performing a redesign operation in connection with an original design, comprising the steps of:
    A. generating two different sets of simulated operational characteristics of said original design;
    B. identifying operational discrepancies between each of said sets of simulated operational characteristics and desired operational characteristics;
    C. identifying the causes of said operational discrepancies; and
    D. generating a redesign of said original design in response to the identified operational discrepancies and discrepancy causes.

11. The method of claim 10 wherein said second step of generating comprises generating a plurality of redesigns of said design, each said redesign generated in response to the identified operational discrepancies and discrepancy causes corresponding to one of said sets of simulated operational characteristics.

12. The method of claim 10 further comprising the steps of generating simulated operational characteristics of said redesign, identifying operational discrepancies between said simulated operational characteristics of said redesign and said desired operational characteristics, and identifying the causes of said discrepancies.

13. The method of claim 12 wherein said simulated operational characteristics of said redesign have a degree of particularity that differs from said simulated operational characteristics of said design.

14. The method of claim 12 further comprising the step of generating a redesign of said redesign in response to the identified discrepancies between said stimulated operational characteristics of said redesign and said discrepancy causes.

15. The method of claim 10 wherein said design is an electronic circuit.

16. A method for performing a redesign operation in connection with an electronic circuit, comprising the steps of:
    A. generating a simulation of said electronic circuit;
    B. generating two different sets of simulated operational characteristics of said simulation;
    C. identifying operational discrepancies between each of said sets of simulated operational characteristics and desired operational characteristics;
    D. identifying the causes of said operational discrepancies;
    E. generating a redesign of said simulation in response to the identified operational discrepancies and discrepancy causes; and
    F. iteratively repeating steps B through E until said simulated operational characteristics are substantially equal to said desired operational characteristics.

* * * * *